United States Patent [19]

Chu et al.

[11] Patent Number: 5,331,199
[45] Date of Patent: Jul. 19, 1994

[54] BIPOLAR TRANSISTOR WITH REDUCED TOPOGRAPHY

[75] Inventors: Shao-Fu S. Chu, Poughkeepsie; Kyong-Min Kim, Hopewell Junction; Shaw-Ning Mei, Wappingers Falls; Victor R. Nastasi, Hopewell Junction; Somnuk Ratanaphanyarat, Poughkeepsie, all of N.Y.

[73] Assignee: International Business Machines Corporation, Armonk, N.Y.

[21] Appl. No.: 46,709

[22] Filed: Apr. 16, 1993

Related U.S. Application Data

[62] Division of Ser. No. 876,597, Apr. 30, 1992, Pat. No. 5,234,846.

[51] Int. Cl.⁵ .................. H01L 29/72; H01L 29/04
[52] U.S. Cl. ........................... 257/587; 257/588; 257/592
[58] Field of Search .................. 257/587, 588, 592

[56] References Cited

U.S. PATENT DOCUMENTS

| | | | |
|---|---|---|---|
| 3,647,581 | 3/1972 | Mash | 148/175 |
| 3,929,528 | 12/1975 | Davidson et al. | 148/175 |
| 4,177,094 | 12/1979 | Kroon | 148/175 |
| 4,554,059 | 11/1985 | Short et al. | 204/129 |
| 4,897,362 | 1/1990 | Delgado et al. | 437/26 |
| 4,902,641 | 2/1990 | Koury | 437/62 |
| 4,970,175 | 11/1990 | Haisma et al. | 437/90 |
| 4,971,925 | 11/1990 | Alexander et al. | 437/62 |
| 4,983,538 | 1/1991 | Gotou | 437/100 |
| 5,032,544 | 7/1991 | Ito et al. | 437/228 |
| 5,034,343 | 7/1991 | Rouse et al. | 437/86 |
| 5,051,378 | 9/1991 | Yagi et al. | 437/225 |

FOREIGN PATENT DOCUMENTS

63-21631 1/1988 Japan.
63-50791 3/1988 Japan.

*Primary Examiner*—Mark V. Prenty

[57] ABSTRACT

A vertical bipolar transistor is constructed with reduced step height by codeposition of a polysilicon base contact member and an epitaxial device layer, thereby placing the base contact below the device surface, and by the use of a doped glass layer as a dopant source for the base contact and as a dopant source to provide a continuous conductive path to the base, and as the dielectric separating the base contact from the emitter contact, and as an etch stop when forming the base implantation aperture.

5 Claims, 3 Drawing Sheets

BIPOLAR TRANSISTOR WITH REDUCED TOPOGRAPHY

This is a divisional patent application of U.S. patent application Ser. No. 07/876,597, filed on Apr. 30, 1992 and now U.S. Pat. No. 5,234,846.

FIELD OF THE INVENTION

The field of the invention is that of making bipolar transistors having reduced topography, or step height.

BACKGROUND OF THE INVENTION

Prior art bipolar transistors, such as that illustrated in FIG. 8, have a number of layers of conductors and insulators in the vicinity of the active elements of the transistor. Interconnection lines must cross a step to enter an aperture above an emitter to make contact with the transistor electrode at the bottom of the aperture. The smaller the dimensions of the transistor, the greater the aspect ratio or ratio of height to width of the emitter aperture. The greater this aspect ratio, or the greater the step, the more prone the transistor is to suffer failure for a number of reasons.

One reason is that of metal penetration and stress-induced failure due to nonconformal metal/dielectric deposition on severe topography (meaning relatively high steps). Another reason is that of device degradation of transistors having small emitters due to non-uniform doping of the emitter because of interference from a sidewall in reason is the formation of a short circuit between the emitter and the base due to nonconformal sidewall deposition. Yet another problem is variability in the size of the emitter opening recess due to the lack of an etch stop of the material (poly in the prior art) covering the base.

The art has employed a number of approaches to reduce the topography of bipolar transistors. Considerations include the interplay between chemical and mechanical considerations in the assembly of a set of layers and electrical considerations in the operation of the transistor. To improve planarity, the basic problem to be addressed is the reduction of thickness of dielectric and/or a reduction in the number of layers. One example of a prior art transistor is illustrated in FIG. 8, showing a structure formed by a two layer polysilicon (poly) process, in which a base connector is formed in poly 1 above the local surface of the wafer. The poly has to extend over the field oxide because of alignment considerations, so that the set of layers is: field oxide, poly 1, and two layers of dielectric.

Another approach is illustrated in U.S. Pat. No. 4,824,799, in which a step of codeposition of polysilicon and epitaxial monocrystalline silicon (epi) is used, with the epi filling a trench etched in a field insulator to provide the starting material for the transistor and the poly being oxidized to provide an interlayer dielectric.

SUMMARY OF THE INVENTION

The invention relates to an improved method of forming a bipolar transistor in which greater planarity is achieved by codeposition of an epitaxial layer that will form the base and a polysilicon layer that will provide electrical contact to the base; and by the use of a doped glass layer above the base region that is used for a number of purposes. The glass layer provides a source of dopant to dope the edges of the base area; it provides a source of dopant for the polysilicon connector that forms the base contact; it contributes to the dielectric that separates the base contact from the emitter contact; it provides an etch stop during the formation of the base aperture; and it reduces the variability in the emitter opening recess due to the lack of an etch stop in the step of removing the layer of polysilicon that forms the base contact.

DETAILED DESCRIPTION OF THE INVENTION

Figure 1:
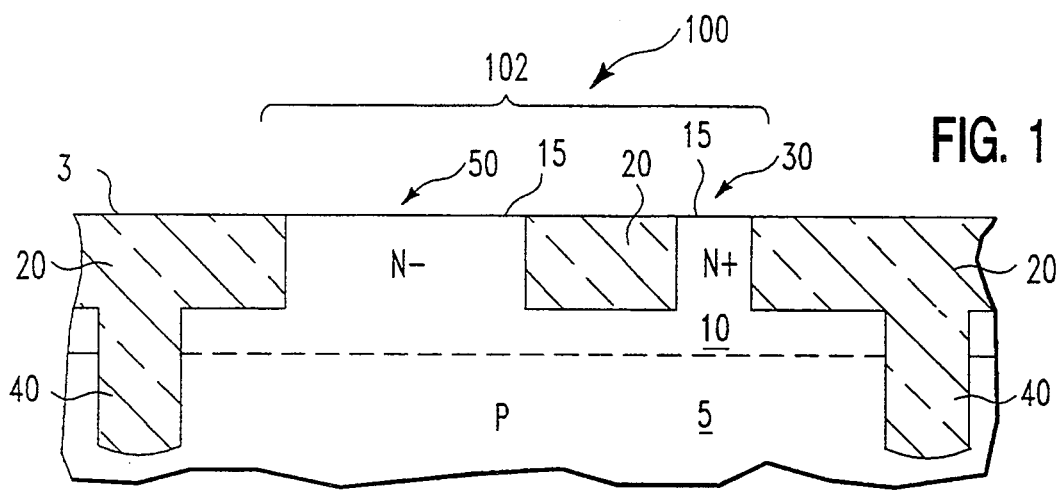
FIGS. 1 through 5 illustrate intermediate steps in forming the transistor.

Referring now to FIG. 1, there is shown in cross-section a portion of a silicon wafer used in fabricating the invention. A P− monocrystalline silicon substrate indicated by the numeral 5 has formed in it a buried conductor layer 10 that is doped N+ in the case of an NPN transistor. A top layer in the figure, denoted with the numeral 15 is an N− epitaxial (sometimes referred to as epi) layer in which the transistor is formed. The areas denoted with the numerals 20 are silicon oxide layers formed by the conventional process of etching trenches in epi layer 15 by any convenient method and then filling the trenches in with silicon dioxide (referred to as oxide) to form a substantially planar surface 3. Transistor isolation is provided by deep trenches 40, which extend down through buried layer 10 into substrate 5.

Transistors constructed according to the invention may be used with silicon on insulator wafers (SOI) in which there is a layer of insulator such as oxide below the transistor areas. In that case, the deep trenches would extend down to the buried insulator, while the shallow trenches stop short of the insulator in order to form the collector extension.

The general area in which the transistors are formed is denoted with numeral 100 and indicated by the bracket labeled 102. On the left of area 100, base region 50 is a portion of epitaxtal layer 15 having an initial concentration of N−. On the right of the transistor area epi region 30, doped N+ in a preliminary doping step, is the electrical contact between the collector and the buried conductor region 10. As is conventional, the emitter and base of transistor 100 will be in the top of area 50 and the collector will be formed by the combination of the bottom of area 50 (below the emitter and the base) and a conductive path extending down to buried connector 10 and then up through vertical collector extension 30.

Figure 2:
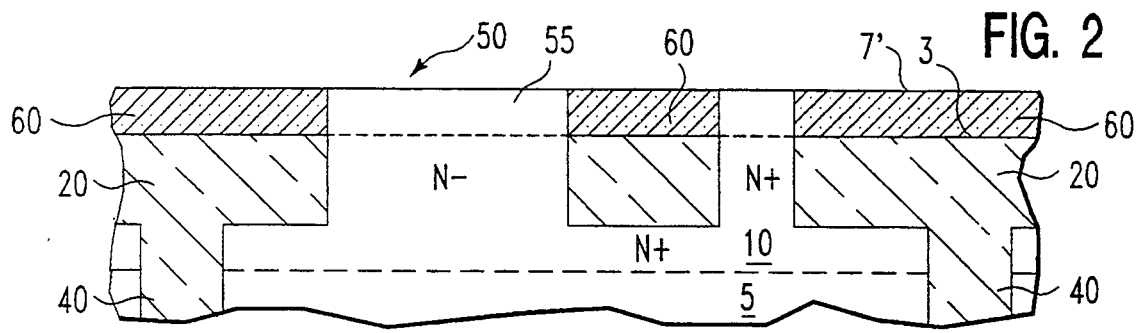

Referring now to FIG. 2, there is shown the results of a step of co-depositing a layer of undoped silicon that comes down as a 2000 Å layer of polysilicon 60 (indicated by the speckles) above oxide 20 and a second layer of epitaxial silicon above the existing epitaxial layer 15 (indicated by the numerals 55 and 35 in the drawing) and also having a thickness of 2000 Å. A new surface 7' has been formed above the old surface 3, which is indicated by a dotted line. The new surface is substantially planar, having a difference in thickness between the epi and poly of about 10% for both atmospheric pressure CVD and ultrahigh vacuum CVD.

The temperature during deposition should be below 650° C.

Figure 3:
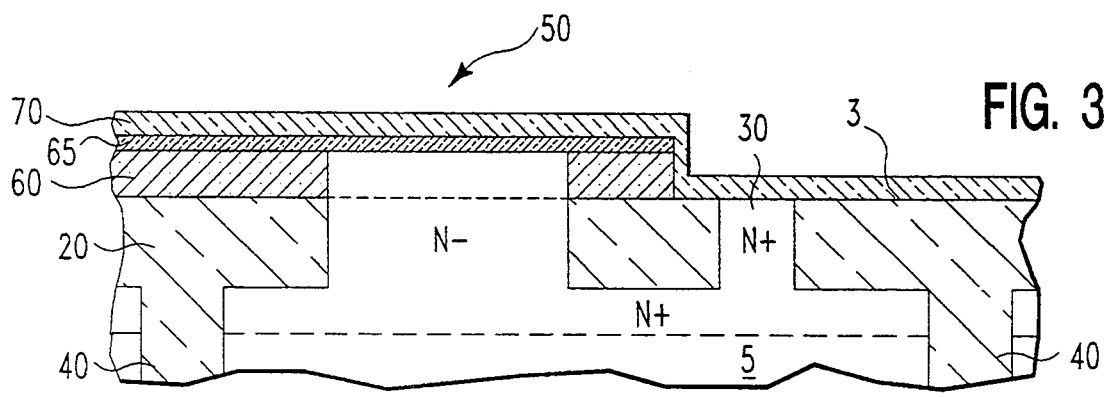

Referring now to FIG. 3, a layer of oxide 65, (referred to as BSG for boro-silicate glass since the dopant in this case is boron for an NPN transistor), has been formed over the entire wafer. Poly 60 and glass 65 have been patterned (by conventional photolithography and etching) and then removed above the collector region. Poly 60 has geometry in which the base surrounds the emitter. In a second step, a layer of silicon nitride (nitride) 70 has been deposited over the entire wafer covering both the base region 50 and collector region 30.

A process option is the removal only of the BSG, in order to avoid counter doping the collector region 30, and retaining the epi layer in that region in order to have a smaller step between the base region 50 and the collector region. In that case, it is necessary to have an additional mask in order to open the collector aperture, so that the use of the option depends on a tradeoff between reduced topography and process complexity.

As will be explained below, the BSG plays several roles in this method. It is put down doped with 13% boron before nitride 70 is deposited. The dopant concentration is made high enough that the BSG serves as a source of dopant for poly 60 and a portion of epi 55 below it. Since the BSG is a dielectric, it serves as part of the dielectric between the first layer of poly 60 and any conductive layer that is placed over it. An additional layer of nitride 70 will be placed on top of the BSG to prevent boron outdiffusion from the BSG.

In the prior art, it was necessary to use a timed etch with a considerable amount of overetch to ensure the complete removal of the base poly when forming the aperture for the emitter because the process did not provide for an etch stop layer. This overetch, which made a deeper step height in the emitter area, is eliminated in this invention because the BSG in this process provides such an etch stop for the process of opening an aperture in nitride 70.

Figure 4:
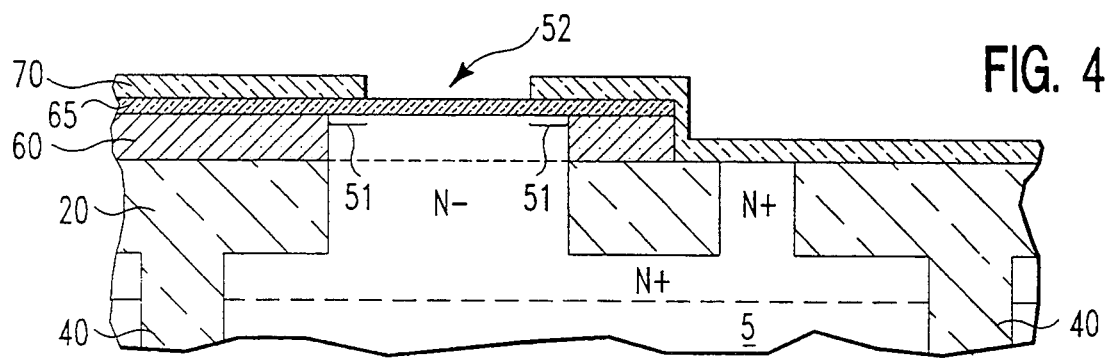

In FIG. 4, a first base aperture 52 has been RIE etched (reactive ion etch) through nitride 70 to define a first base aperture through which the base dopant will be implanted in a subsequent step. BSG 65 serves as an etch stop for this step, using a conventional RIE with $CHF_3/O_2$ as the etch gas. Because of alignment considerations, there will always be some tolerance that needs to be allowed between the base aperture and the boundaries of base region 50. The two brackets denoted with the numeral 51 indicate the extent of this "link" region, which will not be implanted in the base implantation step because of the alignment overhang of nitride 70 and must be doped by some other process.

Figure 5:
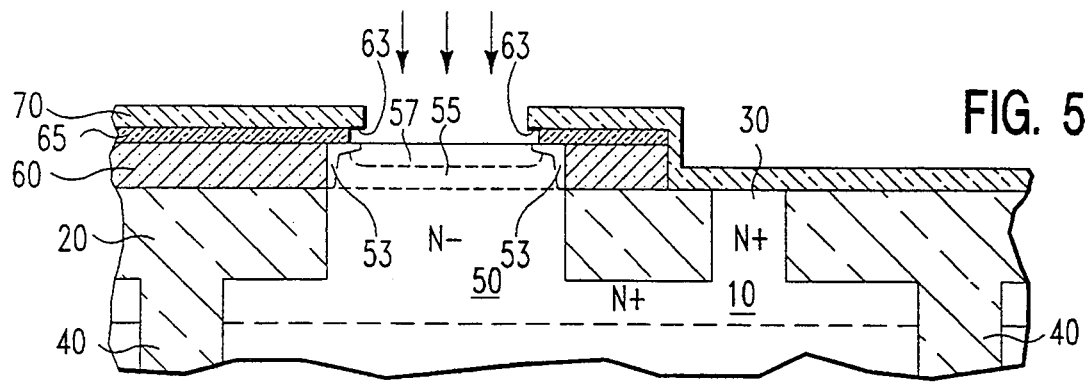

In FIG. 5, a second base aperture has been etched through BSG layer 65 to expose the top surface 59 of the base area. The first and second base apertures have a combined sidewall that is denoted by numeral 63. The lower second base aperture is shown as being somewhat wider because the BSG is preferably removed in a wet etch step (7:1 BHF dip) that undercuts the oxide below the nitride. The area receiving the implantation is denoted by the dotted lines 57, and will become the transistor base. Those skilled in the art will appreciate that the amount of undercut may be controlled by the use of a partial RIE followed by a shorter wet etch or by the use of a RIE that stops on the silicon after penetrating all the way through the BSG.

After the BSG has been etched away, a heating step is performed in which the wafer is heated to a temperature of 900° C. for a period of 20 minutes, so that the boron in the BSG diffuses out of the oxide into the polysilicon, thus forming the doping step of doping polysilicon 60 and also at the same time forms link areas 53. The BSG was put down with a nominal volume density of $5 \times 10^{20}/cm^3$ and the diffusion step dopes link 51 and poly 60 to a P+ concentration.

Also, in FIG. 5, there is shown an implantation step that implants a dose of $2 \times 10^{13}$ of boron at or below 10 KeV through aperture 52 to form base 57. This base implant is made after the BSG heating step and can be activated in a separate annealing step or by a combination of several high temperature steps that combine to have the same effect as a single step. Preferably, the high temperature activation step is a few seconds at a temperature of about 1000° C. The nominal volume density of dopant in the link areas is $5 \times 10^{17}/cm^3$ to a depth of 1500 Å below the BSG and the nominal volume density of dopant in base 57 is $1 \times 10^{18}/cm^3$ to a depth of 1500 Å.

The implanted region 57 is thermally reoxidized in order to ensure good surface passivation and also to prevent direct contact between the nitride and the silicon surface, which would cause high stress in the silicon.

The sidewalls 63 of aperture 52 are exposed, so that, over time, the boron dopant in glass 65 could diffuse into the base or emitter area. Therefore, in the next step a second layer of nitride is deposited over nitride 70 and is removed by a following RIE process using $CF_3/O_2$. This step forms nitride sidewalls 75 on either side of aperture 52 that serve as a diffusion barrier to prevent the diffusion of boron out of BSG 65 into the transistor and as an electric insulator to separate the emitter and base electrodes. The sidewalls are also necessary to reduce the base aperture diameter to permit the doping of the emitter of the transistor without danger of a short circuit from the emitter contact poly 80 to base contact poly 60.

Figure 6A:
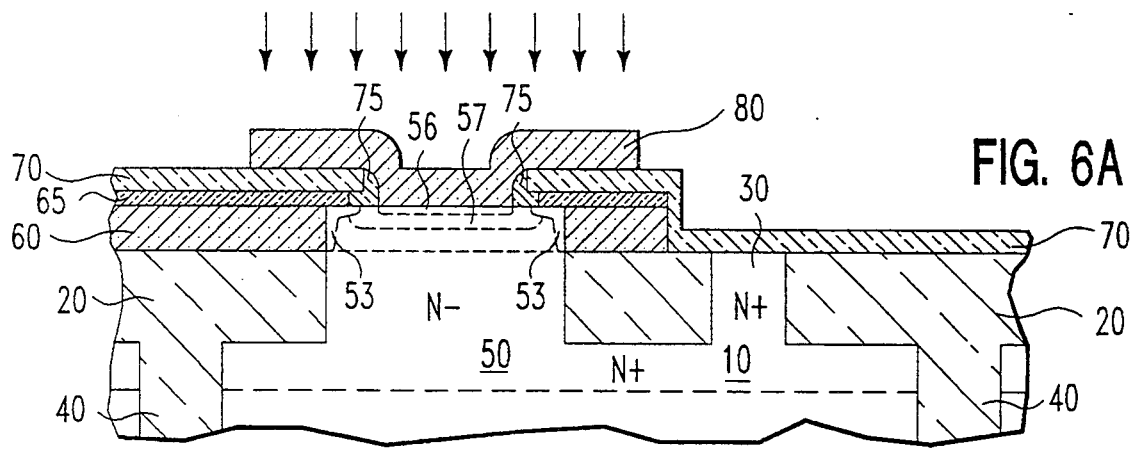
FIGS. 6A and 6B show a late step in the process and a detail of the structure formed by the step.

Referring now to FIG. 6A, there is shown one of the later steps in the process, in which a second layer of polysilicon 80 has been deposited filling the aperture 52. This poly is implanted with an N type dopant which is then diffused, doping the polysilicon and also diffusing out from the polysilicon 80 into base 57 in epitaxial layer 55 to form a counterdoped layer that is the emitter 56. The implant dose is a nominal $1-2 \times 10^{16}$ of As at 40 KeV.

And the heating cycle is a nominal 900° C. for 5 minutes, resulting in a shallow emitter 56 that has a nominal thickness of 500 Å.

Figure 6B:
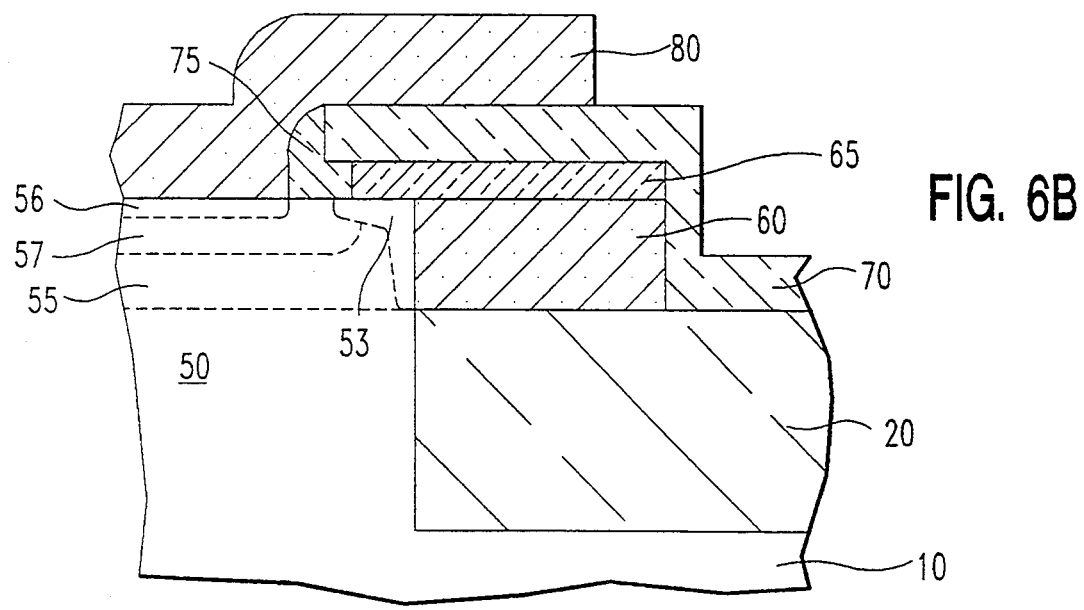

FIG. 6B shows in more detail the corner of aperture 52 showing BSG 65 isolated from polysilicon 80 by sidewall 75. The area denoted by the numeral 53 is a link area that extends downwardly from BSG 65 by a greater depth because of the direct downward diffusion of boron from the BSG into the ept and inwardly by a smaller amount because of the then to the epi 55. The amount of dopant in the BSG and the diffusion cycle are set together with the alignment tolerance for the position of aperture 52 so that there is a path from base 57 through the link area 53 into base conductor 60 that has a P+ concentration of $2 \times 10^{20}/cm^3$.

Figure 7:
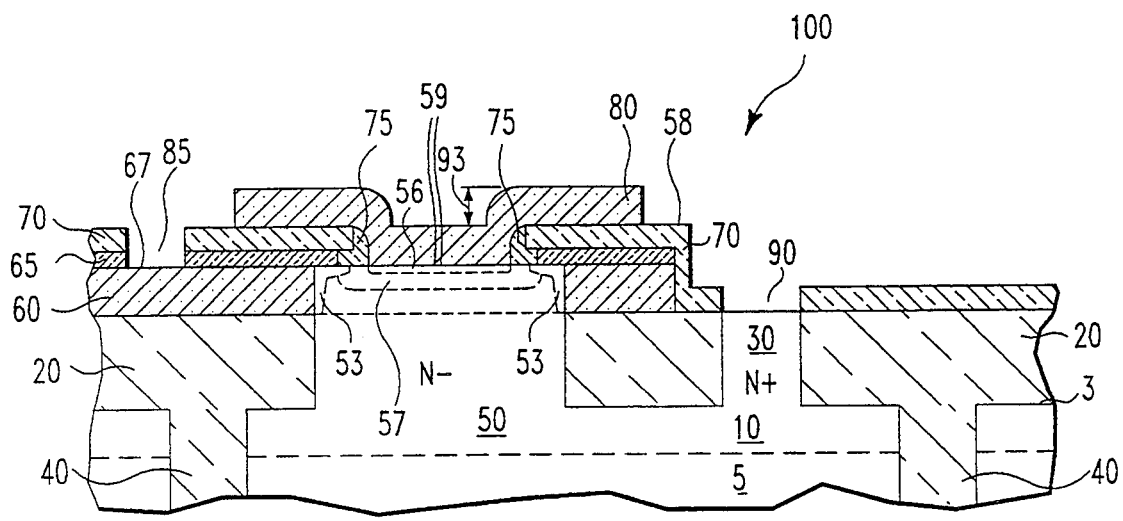
FIG. 7 illustrates in cross-section a transistor constructed according to the invention.

FIG. 7 illustrates in cross section a completed transistor constructed according to the invention. Old surface 3 is shown with a dotted line passing horizontally through the vertical epi regions—base epi region 50 and collector extension 30. Regions 50 and 30 are separated by a dielectric member 20, formed from a deposited dielectric (SiO$_2$). Poly 60 is disposed above insulator 20, also above the old surface 3, and abutts a base portion of epi 50 containing base 57 and emitter 56. Poly 60 has a top surface 67 that is coplanar with an epi top surface that is also the top surface of the emitter, so that it is also the device top surface. A composite dielectric member comprising BSG 65 and nitride 70 is disposed above poly 60 and also! above a link region of the base portion. There is a base aperture in the composite dielectric member that is used for the implantation of the base and the diffusion of the emitter. Base aperture sidewalls ring the base aperture and provide for horizontal separation of the base and emitter. Aperture 85 on the left is cut at any convenient time, preferably at the same time as ept 90, to permit the connection of the base electrode. In this process, the connection is made with a metal interconnect, but it may be poly 1 or poly 2 if been cut to provide for connection to the collector conductive lead 30, in electrical contact with the N− collector below base 57. BSG 65 is heavily doped with boron and is separated from emitter connector 80 and from emitter 56 to prevent diffusion of boron out from the BSG.

The dopant concentration in the base region is characteristic of an implanted dopant, with a peak concentration at a nominal depth of 8000 Å below surface 59. The dopant concentration of the emitter is characteristic of a diffused layer, having a peak concentration at surface 59, since the emitter has been formed by diffusion across that surface from poly connector 80. In the link areas, on either side of the base, the dopant gradient is also characteristic of a diffused dopant, since this dopant also was diffused across surface 63, from BSG 65 in this case. There is a continuous P+ region extending from base 57 through link 53 and into poly 65.

The emitter topography of transistor 100 is conventionally measured from surface 59 to the top surface 58 of nitride 70, and is 0.1 microns for a BSG thickness of 0.05 μm and a final nitride thickness of 0.05 μm. The nominal width of base aperture 52 between sidewalls is 0.5 μm, giving an aspect ratio of 0.2.

Figure 8:
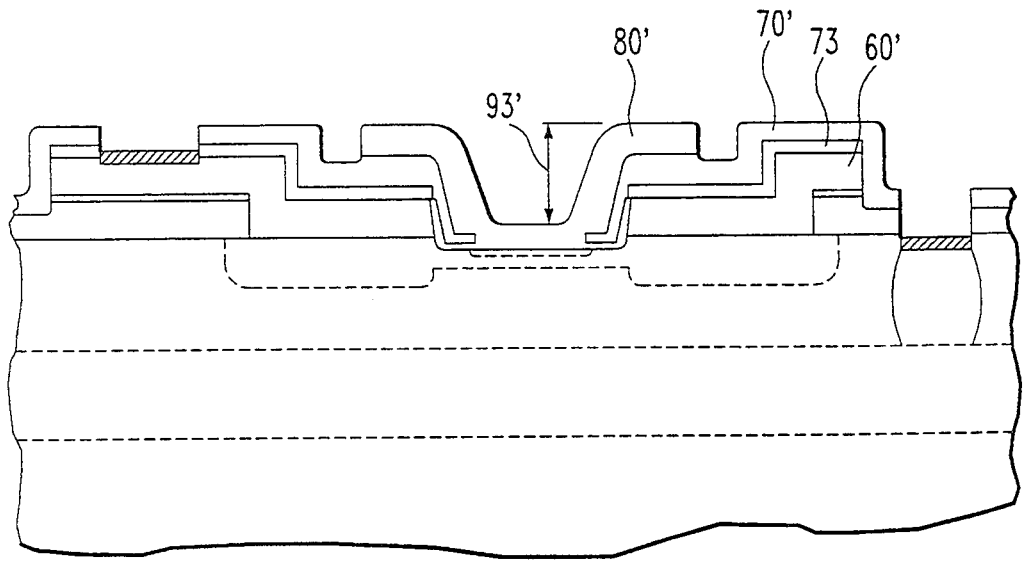
FIG. 8 illustrates in cross-section a prior art transistor.

For comparison, FIG. 8 illustrates a prior art transistor as illustrated in T. H. Ning, et al "Self-Aligned N-P-N bipolar Transistors", 1980 IDEM Digest pp 823–824, in which the comparable step height is 0.7 micron, provided by a base poly 60' of 0.25 μm, an intermediate oxide 73 of 0.2 μm that does not provide the same functions as oxide 65, and a nitride 70' (0.15 μm) plus a recess formed in the emitter aperture of 0.1 μm. The nominal width of the base aperture between sidewalls is 0.5 μm, giving an aspect ratio of 4.

For convenience, the parameters of the main steps in the process are set out in Table I. The left column indicates parameters of the process for the formation of an NPN transistor and the right column indicates corresponding parameters for a PNP transistor. Since the geometry is the same for both types of transistor, there is no need for additional figures. Phosphorous (P) replaces boron as the dopant for the oxide, forming PSG instead of BSG and arsenic is used for the base implant.

Those skilled in the art will readily be able to devise additional embodiments of the invention, and the scope of the claims is not intended to be limited to the embodiments disclosed.

TABLE I

| # | NPN | PNP |
|---|---|---|
| 0 | Start with conventional low doped − epi layer | |
| | above highly doped + buried layer - etch trenches and fill with oxide to give planar surface. Form + vertical collector connector. | |
| | N-doping | P-doping |
| 1 | Codeposit undoped poly (2000Å) connector for base contact and undoped epi layer for base. | |
| 2 | 1000Å glass - source of "link" dopant and dielectric to separate emitter, base conductors. | |
| | BSG 13% boron | PSG 13% phosphorous |
| 3 | RIE BSG, poly and epi above collector contact area - stop on thick oxide. | |
| 4 | Deposit Nitride (1000Å) | |
| 5 | RIE base aperture/stop on BSG - strip BSG in base aperture, exposing link areas because of tolerance. | |
| 6 | Diffuse and activate - 900° C. for 20 min glass dopes poly and forms + link | |
| | N-doping | P-doping |
| 7 | Implant base through existing aperture. | |
| | 2 × 10$^{13}$ B at <10 KeV | 2 × 10$^{13}$ As at <120 KeV |
| 8 | Oxidize base area. Pressure >1 atmosphere, temperature <900° C. | |
| 9 | Deposit 1000Å nitride for emitter sidewalls. | |
| 10 | RIE emitter sidewalls. | |
| 11 | Deposit and dope 1800Å poly for emitter contact. | |
| | 1 × 10$^{16}$ As, diffused at 900° C. for 5 min. | 1 × 10$^{16}$ B, diffused at 800° C. for 5 min. |
| 12 | RIE emitter poly, stop on nitride. | |

We claim:

1. A bipolar transistor formed in a first silicon epitaxial layer above a silicon substrate and in a second silicon epitaxial layer above said first silicon epitaxial layer, comprising a base in said second epitaxial layer disposed above a base-collector junction and an emitter, having an emitter top surface, disposed above said base and connected thereto by an emitter-base junction, said base-collector junction being disposed above a collector portion of said first epitaxial layer extending downwardly to a buried conductor extending horizontally to a vertical collector extension that extends upwardly to a collector contact, said base and said collector extension being separated horizontally by an insulating member, in which said insulating member has an insulating member top surface substantially coplanar with a first epitaxial surface of said first silicon epitaxial layer and substantially below said emitter top surface;

a base contact layer of polysilicon is disposed above said insulating member with a polysilicon top surface;

said second epitaxial layer of silicon containing said emitter is disposed above said first epitaxial layer, having a top surface substantially coplanar with said polysilicon top surface;

a doped layer of a first dielectric, doped with a base dopant of a first polarity, is disposed above said second epitaxial layer's top surface and said polysilicon top surface, and has a base aperture therein above said emitter, said base aperture being separated horizontally from said layer of polysilicon by a horizontal link distance;

a doped polysilicon emitter contact member, doped with an emitter dopant of a second polarity opposite said first polarity, is disposed in contact with said emitter top surface in said base aperture;

a sidewall spacer of a second dielectric different from said first dielectric and impermeable to said dopant of said first polarity is disposed within said base aperture between said polysilicon emitter contact and said first dielectric;

said layer of polysilicon above said insulating member is doped with said base dopant having a concentration gradient with a maximum at said polysilicon top surface abutting said first dielectric;

a link region of said second epitaxial layer below said link distance is doped with said base dopant having a concentration gradient with a maximum at said second epitaxial layer's top surface abutting said first dielectric, said layer of polysilicon and said link region of said second epitaxial layer each having a predetermined concentration of said base dopant sufficient to form a conductive path extending from a base contact area of said layer of polysilicon through said link region of said second epitaxial layer to said base; and said emitter has a concentration gradient of said emitter dopant having a maximum at that portion of said second epitaxial layer's top surface abutting said polysilicon emitter contact member.

2. A transistor according to claim 1, further characterized in that:

said polysilicon emitter contact member extends transversely above said doped layer of said first dielectric, whereby said polysilicon emitter contact member is separated vertically from said base contact layer by only said layer of said first dielectric.

3. A transistor according to claim 1, further characterized in that:

a layer of said second dielectric, having a second dielectric top surface, is disposed above said layer of said first dielectric, said first and second dielectrics together having a predetermined dielectric thickness, and said polysilicon emitter contact member extends transversely above said layer of said second dielectric, whereby said polysilicon emitter contact member is separated vertically from said base contact layer by only said predetermined dielectric thickness.

4. A transistor according to claim 3, further characterized in that:

said vertical collector extension has a collector top contact surface substantially coplanar with said insulating member top surface, whereby a step having a step height of a polysilicon thickness of said polysilicon layer and said predetermined dielectric thickness exists between said second dielectric top surface and said collector top surface.

5. A transistor according to claim 3, further characterized in that:

said vertical collector extension has a collector top contact surface substantially coplanar with said emitter top surface, whereby a step having a step height of aid predetermined dielectric thickness exists between said second dielectric top surface and said collector top surface.

* * * * *